United States Patent [19]

Kohira et al.

[11] 4,434,223

[45] Feb. 28, 1984

[54] IMAGE-FORMING ELEMENT HAVING AN ALUMINUM LAYER ON A TRANSPARENT FILM BASE

[75] Inventors: Takeo Kohira; Takao Taguchi, both of Chiba; Takeo Sugiura, Tokorozawa; Takatoshi Ohta, Warabi, all of Japan

[73] Assignees: Toppan Printing Co., Ltd., Tokyo; Okamoto Chemical Industry Co., Ltd., Saitama, both of Japan

[21] Appl. No.: 452,919

[22] Filed: Dec. 27, 1982

[51] Int. Cl.$^3$ ............................................. G03C 1/78
[52] U.S. Cl. ................................. 430/273; 430/271; 430/278; 430/281; 430/285; 430/288; 430/905; 430/910
[58] Field of Search ............... 430/271, 273, 288, 278, 430/281, 285, 905, 910

[56] References Cited

U.S. PATENT DOCUMENTS 4,131,518 12/1978 Fromson ............................. 430/278
4,242,438 12/1980 Sato ..................................... 430/278

*Primary Examiner*—Jack P. Brammer
*Attorney, Agent, or Firm*—Bacon & Thomas

[57] ABSTRACT

An image-forming element comprises a transparent base film, an aluminum film deposited on the base film, and a photosensitive layer formed on the aluminum film and which can be developed with an alkali aqueous solution developer. The photosensitive layer comprises of (a) 20 to 60% by weight of a copolymer of a vinyl toluene and a monoester of an unsaturated dibasic acid, (b) 10 to 70% by weight of an addition-polymerizable, ethylenically unsaturated monomer which is an acrylate or a methacrylate of a fatty polyhydroxy alcohol having at least two terminal ethylene groups and at least one hydroxyl groups, and (c) 0.5 to 30% by weight of a photopolymerization initiator.

16 Claims, No Drawings

IMAGE-FORMING ELEMENT HAVING AN ALUMINUM LAYER ON A TRANSPARENT FILM BASE

BACKGROUND OF THE INVENTION

The present invention relates to an image-forming element and, more particularly, to a photosensitive image-forming element which is capable of providing a graphic arts film of high density and high gradation which is used in the manufacture of a printing plate.

A conventional image-forming element is known wherein a transparent base film, an aluminum-deposited layer and a photosensitive layer are sequentially laminated. Such a conventional image-forming element is described, for example, in Japanese Patent Disclosures No. 51-135,641 and No. 52-99,810. Two major methods are known for forming a graphic arts film with an image using such an image-forming element. In one of these methods, the developing step and the etching step are sequentially performed. In the other method, these steps are performed simultaneously.

According to the former method, a photosensitive layer consisting of a photosensitive material such as polyvinyl cinnamate is developed with xylene which will not etch aluminum. Thus, an etching-resistant resist image is formed on the deposited aluminum layer. Subsequently, that portion of the aluminum layer which is not covered with the resist image is etched with an etchant such as an acidic or alkali etching liquid. An aluminum image is thus formed. The aluminum image obtained by this method has satisfactory light-shielding properties with regard to ultraviolet and visible light rays. Meanwhile, part of the base film such as a polyester film which is not covered with the aluminum image transmits such light rays well.

However, this method requires the use of two different types of processing agents, frequently causing problems. For example, when the resist film portion at the non-image portion is not completely removed in the developing step, etching of the aluminum layer is not sufficiently performed and an irregular aluminum image is formed in the etching step. The method also requires a long treatment time.

The disadvantages of the former method are solved by the latter method since it uses a developer which also serves as an etchant. However, with this method, the resist image must have particularly good resist properties. With a known photosensitive material, the photopolymerized portion of the resist image swells during etching to cause blistering or separation of the resist image from the deposited aluminum layer. Especially in the case of a fine resist image, the resist cannot serve its original purpose, and etching progresses to that portion of the aluminum layer covered with the resist image. In some cases, the aluminum layer may be completely removed. This method can only provide a low resolution and low γ-property, and pinholes are easily formed in the portion of the aluminum image corresponding to a solid region of a wide area.

In order to provide an improvement over these two methods, it has been proposed, as per Japanese Patent Disclosure No. 50-139,720, to deposit on the surface of the deposited aluminum layer a metal which has good adhesion strength with the resist film and which has a smaller ionization tendency than aluminum, thus promoting the etching of the aluminum layer. According to this method, it is possible to improve somewhat adhesion strength between the aluminum layer and the resist image. However, this method still fails to provide good adhesion strength between the aluminum layer and the resist image. It is, furthermore, considerably difficult to deposit another metal on the surface of an aluminum film having a thickness of about 500 to 1,000 Å. Deposition of the metal is time-consuming. Moreover, scratched traces may be easily formed on the metal layer deposited on the aluminum layer correspondent to increase in number of steps, providing only an unsatisfactory graphic arts film.

SUMMARY OF THE INVENTION

It is an object of the present invention to provide an image-forming element which provides excellent adhesion strength between an aluminum layer and a photosensitive layer and which has good sensitivity.

In order to achieve the above object, there is provided according to the present invention an image-forming element which comprises a transparent base film, an aluminum film deposited on the base film, and a photo-sensitive layer formed on the aluminum film, and which can be developed with an alkali aqueous solution developer, characterized in that the photosensitive layer comprises (a) 20 to 60% by weight of a copolymer of a vinyl toluene and a monoester of an unsaturated dibasic acid, (b) 10 to 70% by weight of an addition-polymerizable, ethylenically unsaturated monomer which is an acrylate or a methacrylate of a fatty polyhydroxy alcohol having at least two terminal ethylene groups and at least one hydroxyl group, and (c) 0.5 to 30% by weight of a photopolymerization initiator.

In an image-forming element according to the present invention, a protective layer consisting of a cover sheet or an aqueous resin film may be formed on the surface of the photosensitive layer in order to prevent polymerization by oxygen in the air and blocking with other material.

Furthermore, in an image-forming element according to the present invention, the photosensitive layer may further contain a dye, a pigment, a heat polymerization inhibitor and a chain transfer agent.

DETAILED DESCRIPTION OF THE PREFERRED EMBODIMENTS

The first component of a photosensitive layer of an image-forming element of the present invention is a copolymer of a vinyl toluene and a monoester of an unsaturated dibasic acid. Vinyl toluene may be a mixture of various isomers. The unsaturated dibasic acid may be maleic acid, fumaric acid, itaconic acid, or a mixture thereof. The monoester of unsaturated dibasic acid may be a monoalkyl ester having a carbon number of 1 to 10, or an ester of a monoalkyl ether (having a carbon number of 1 to 10) of ethylene glycol or propylene glycol. Examples of the monoalkyl ester having a carbon number of 1 to 10 may include monomethyl ester, monoethyl ester, monopropyl ester, monoisopropyl ester, monobutyl ester, monoisobutyl ester, monopara-tert. butyl ester and the like. Examples of the ester of the monoalkyl ether of ethylene glycol or propylene glycol may include 2-methoxyethyl ester, 2-ethoxyethyl ester, 2-butoxyethyl ester, 2-amyloxyethyl ester, 2-methoxypropyl ester, 2-ethoxypropyl ester, 2-propoxypropyl ester, 2-amyloxypropyl ester and the like.

The most preferred examples of the unsaturated dibasic acid are monobutyl (n-butyl, isobutyl, p-t-butyl) maleate and monobutyl (n-butyl, isobutyl, p-t-butyl) itaconate.

As for the mixing ratio of the copolymer, a vinyl toluene is preferably contained in an amount of 40 to 60 mol% and an unsaturated dibasic acid monoester is preferably contained in an amount of 40 to 60 mol%. When the amount of vinyl toluene exceeds 60 mol%, development of the photosensitive layer becomes difficult. On the other hand, when the amount of vinyl toluene is below 40 mol%, the quality of the resist image is degraded. Another monomer may be added to the vinyl toluene and the unsaturated dibasic acid. Examples of such a monomer may include a diester of an unsaturated dibasic acid described above, a lower alkyl ester of acrylic acid or methacrylic acid, maleic acid, maleic acid anhydride, fumaric acid, itaconic acid, itaconic acid anhydride, acrylonitrile, methacrylonitrile, acrylic acid, methacrylic acid, and the like. Major examples of the unsaturated dibasic acid diester may include esters such as dimethyl, methylethyl, diethyl, dipropyl, diisopropyl, dibutyl, diisobutyl, dioctyl and the like of maleic acid, fumaric acid, and itaconic acid. The lower alkyl ester of acrylic acid or methacrylic acid may be ethyl acrylate, methyl methacrylate, ethyl methacrylate, isobutyl methacrylate or the like. The content of the additional monomer is 0 to 20% by weight.

The mixing ratio of the copolymer containing an additional monomer is preferably such that the content of a vinyl toluene is 45 to 55 mol%, the content of a monoester of an unsaturated dibasic acid is 45 to 55 mol%, and the content of an unsaturated dibasic acid is 0 to 20 mol%.

The polymerization method of these materials to obtain the copolymer may be freely selected. Polymerization is preferably performed by radical polymerization in the form of solution polymerization. The copolymer may be prepared by two different methods. According to one method, the monomers are polymerized. According to the other method, after preparing a copolymer of a vinyl toluene and an unsaturated dibasic acid, the copolymer is esterified with a desired alcohol in the same reaction solution using an esterifying catalyst such as triethyl amine or p-toluene sulfonic acid.

The acid value of the resultant copolymer is 50 to 300 and is preferably 150 to 260. The molecular weight of the resultant copolymer is 1,000 to 1,000,000, preferably 3,000 to 100,000 and most preferably 3,000 to 50,000. The molecular weight here means the number average molecular weight measured by gel permeation chromatography.

The second component of the photosensitive layer of the present invention is an addition-polymerizable ethylenically unsaturated monomer which is an acrylate or methacrylate of a fatty polyhydroxy alcohol having at least two terminal ethylene groups and at least one hydroxyl group. Such an unsaturated monomer may be an acrylate or methacrylate such as trimethylol propane, pentaerythritol, dipentaerythritol, or their ethylene oxide addition product or propylene oxide addition product. Examples of such an unsaturated monomer may include trimethylol propane diacrylate, pentaerythritol triacrylate, triacrylate of (4 mol)ethylene oxide addition product of pentaerythritol, and tryacrylate of (8 mol)propylene oxide addition product of pentaerythritol; and corresponding methacrylates thereof.

When such an acrylate or methacrylate is prepared, various mixtures are produced. In some cases, an acrylate or methacrylate having no free hydroxyl group may be mixed in. However, if the resultant mixture contains mainly the objective acrylate or methacrylate, it may be used for image forming. However, if an acrylate or methacrylate having no hydroxyl group is contained in an amount exceeding 60 mol%, the resist image tends to be separated from the aluminum layer. The developing speed is significantly degraded. Although another material such as another ethylenically unsaturated monomer, epoxy diacrylate, urethane acrylate, acrylamide, or N,N-methylene bisacrylateamide may also be added.

The most preferable one of the acrylates or methacrylates described above is pentaerythritol triacrylate.

The third component of the photosensitive layer according to the present invention is a photopolymerization initiator. Examples of such a photopolymerization initiator may include aromatic ketones, e.g., benzophenone, diethoxybenzophenone, chloromethylbenzophenone, 4,4'-bis(methylamino)benzophenone, 4,4'-bis(dimethylamino) benzophenone, 4,4'-bis(diethylamino) benzophenone, ethylanthraquinone, 2-chlorothioxanthone, and diisopropylthioxanthone; benzoin and benzoin ethers, e.g. benzyldimethylketal; and 2,4,5,-triarylimidazole, e.g., 2-(o-chlorophenyl)-4,5-diphenylbiimidazole, or 2-(o-chlorophenyl)-4,5-di-(m-methoxyphenyl)biimidazole. Biimidazoles described in U.S. Pat. No. 3,445,234, No. 3,549,367, and No. 3,652,275 may also be used. The initiators are described above may be used singly or in admixture with each other.

Although the copolymer is removed by dissolution or swelling with an alkali aqueous solution, it is not completely dissolved. An ethylenically unsaturated monomer especially one with a hydroxyl residue increases adhesion to the aluminum layer and has plasticity to facilitate dissolution of the copolymer. Thus, by the presence of the ethylenically unsaturated monomer, the non-exposed portion of the photosensitive layer is completely removed by being dissolved and does not remain on the surface of the aluminum layer. For this reason, etching of the aluminum layer using the resist image as a mask progresses smoothly.

When an ethylenically unsaturated monomer such as trimethylolpropanetriacrylate which is outside the scope of the present invention is used, etching of the aluminum layer requires three times the amount of time required in the present invention. Furthermore, it causes blistering of the photopolymerized photosensitive layer from the aluminum layer. When an aqueous diacrylate having 4 or more ethylene oxides such as polyethyleneglycoldiacrylate is used, relatively good developing characteristics are obtained. However, the photopolymerized resist image is weak against the alkali aqueous solution and causes blistering from the aluminum layer.

The composition of the photosensitive layer according to the present invention is such that the content of the copolymer is 20 to 60% by weight and preferably 30 to 55% by weight, the content of the ethylenically unsaturated monomer is 10 to 70% by weight and preferably 35 to 65% by weight, and the content of the photopolymerization initiator is 0.5 to 30% by weight and preferably 5 to 20% by weight.

When the content of the copolymer is below 20% by weight or when the content of the ethylecically unsaturated monomer exceeds 70% by weight, the photosensitive layer becomes tacky and the resist image may cause blistering from the aluminum layer. When the content of the copolymer exceeds 60% by weight or the content of the ethylenically unsaturated monomer is below 10% by weight, the sensitivity is lowered and the resist image may not be formed. When the content of the photopolymerization initiator is below 0.5% by weight, the sensitivity is lowered and the resist image may not be formed. When the content of the photopolymerization initiator exceeds 30% by weight, the strength of the photosensitive layer is weak and the surface becomes rough.

Colorants such as a dye, a pigment and the like may be added to the photosensitive layer of the present invention as needed.

Examples of the dye may include dibasic dyes or dibasic oil dyes such as crystal violet, victoria blue, malachite green, rhodamine B, auramine, and their metallic salts; eosine B; erythrosine; rose bengal; azo dyes; anthraquinone dyes; and the like. Since most of the dyes tend to interfere with photopolymerization of the photosensitive layer, a dye which may not impair adhesion strength and photopolymerization must be selected. A dye is particularly preferable which does not absorb light of the wavelength of the photopolymerization initiator described above.

Examples of the pigment may include carbon black, a phthalocyanine pigment, titanium oxide, dioxazine violet, a quinacridone pigment, and the like.

The content of the colorants may be such that the content of the dye is 0.01 to 10% by weight and the content of the pigment is 0.1 to 30% by weight based on the total weight of the photosensitive layer.

The addition of the colorants (which are added to confirm the photopolymerization state of the photosensitive layer) degrades adhesion and sensitivity as described above.

For this reason, if required, the photopolymerized layer (obtained by exposure and development of the photosensitive layer) may be post-dyed with a solution of the dye as mentioned above in water or a solvent. Post-dyeing is an effective means for confirmation of the image during the next step of reducing. Addition of the colorants to the photosensitive layer allows good reproducibility of fine pattern and prevents halation. Therefore, both the addition of the colorants and post-dyeing may be performed.

A heat polymerization inhibitor may also be added as needed. Examples of the heat polymerization inhibitor may include hydroquinone, p-methoxyphenol, phenochiazine and the like. A chain transfer agent such as N-phenylglycine, mercaptobenzoxazol or the like may also be added.

An image-forming element of the present invention may be obtained by sequentially forming an aluminum-deposited layer and a photosensitive layer on a base film and by forming, as needed, a cover sheet, an aqueous resin layer or the like on the photosensitive layer. More specifically, an aluminum-deposited layer of 500 to 2,000 Å thickness is formed by deposition of aluminum on a base film consisting of polyester or the like and having a thickness of 50 to 150μ. A photosensitive resin as mentioned above is dissolved in a solvent such as 2-methoxy ethanol. The resultant solution is coated on the aluminum-deposited layer with a coater and the coated layer is dried. A photosensitive layer may be formed on a commercially available aluminum-deposited film (e.g., "METARUMII" available from Toray Industry) to provide an image-forming element of the present invention.

The photosensitive layer is formed to a thickness of 0.2 to 20 μm, preferably 0.5 to 1 μm.

The cover sheet or the aqueous resin layer which is formed on the photosensitive layer as needed serves to prevent polymerization of the photosensitive layer by the presence of oxygen and also serves to prevent blocking of the photosensitive layer with other materials. The cover sheet may be a transparent resin film of polyester, polycarbonate or the like. The aqueous resin layer may consist of polyvinyl alcohol, polyvinyl pyrrolidone or the like of low polymerization degree. The thickness of the aqueous resin layer is 0.1 to 10 μm and is preferably 1 to 3 μm.

The photosensitive layer of the present invention may further contain as an assistant benzophenone-o-carboxylic acid, p-nitrophenol, nonionic surfactant or the like.

In order to prepare a printing plate using an image-forming element of the present invention, the element and a negative original are attached to each other by suction. Thereafter, the element is exposed to light from a light source which is capable of emitting active rays, e.g., ultraviolet rays for photopolymerization of the photosensitive layer. The light source may be a mercury lamp, an ulra high-pressure mercury lamp, a metal halide lamp or the like. The exposed element is immersed in an alkali solution which is capable of simultaneously performing development and etching within at most 2 minutes. The alkali solution may be a solution of lithium hydroxide or sodium hydroxide with an assistant such as sodium chloride, sodium fluoride, or 2-butoxy ethanol added thereto. The development and etching is preferably performed at a temperature of 30°±5° C. Then, the non-exposed portion of the photosensitive layer and the aluminum-deposited layer are simultaneously removed to form an objective image without impairing it.

The present invention will now be described by way of examples below.

EXAMPLE 1

(1) Preparation of Copolymer

To a four neck distillation flask were mounted a thermometer, a nitrogen inlet tube, a reflux condenser, and a stirrer. The flask was charged with a mixture of the composition below:

Vinyl toluene: 590 g;
Maleic anhydride: 490 g;
Dioxane: 2160 g.

The flask was heated to and kept at a temperature of 60° C. in a warm water bath and nitrogen gas was introduced into the flask.

After adding 5 g of B.P.O. (benzoyl peroxide) to the reaction solution and stirring was continued. Within about 1 hour, the internal temperature of the flask reached 103° C. After stirring was further continued for 3 more hours, 10 g of trimethylamine and 380 g of butyl alcohol were added to the reaction solution which was then heated to 100° C. The reaction solution first became turbid. However, as the reaction proceeded, the reaction solution became transparent. After about 3 hours, the reaction solution was poured into a large quantity of water to precipitate a white copolymer. A substantially transparent copolymer was obtained by drying with heated air at 70° C. for 6 hours. This copolymer was named Copolymer 1. The viscosity of a 20% by weight solution of Copolymer 1 in 2-methoxyethanol was measured to be 150 c.p.s. (at 25° C.) using a Brookfield rotational viscosimeter. The solution had an acid value of 250 and a molecular weight of 20,000.

(2) Adjustment and use of image-forming element

A photosensitive solution of the composition below was coated with a whirler on a polyester film on which aluminum was deposited to a thickness of 1,000 Å. The coated layer was dried at 70° C. for 30 minutes to form a photosensitive layer.
Copolymer 1: 5 g;
Pentaerythritol triacrylate: 4 g;
Benzyldimethylketal: 0.4 g;
p-Methoxyphenol: 0.01 g;
n-Phenylglycine: 0.1 g;
2-Methoxyethanol: 100 g.
The photosensitive layer had a thickness of 0.7 μm.

An aqueous solution (10% by weight) of a polyvinyl alcohol of low polymerization degree was coated on the photosensitive layer and the coated layer was dried to have a thickness of 1 μm, thereby completing the image-forming element.

After attaching a negative original on the element by suction, the element was exposed by light from an ultra high-pressure mercury lamp (1 m distance) of 2 kW. The film was then immersed in a developing solution of the composition below at 30° C. for 30 seconds.
Sodium hydroxide: 10 g;
Sodium chloride: 1 g;
2-Butoxyethanol: 5 g;
Water: 984 g.

The non-exposed portion of the photosensitive layer and the aluminum-deposited layer are simultaneously removed and a positive image was obtained without causing any blistering of the photopolymerized layer.

EXAMPLE 2

(1) Preparation of Copolymer

A flask with attachments similar to those used in Example 1 was prepared and was charged with a mixture of the composition below:
Vinyl toluene: 600 g;
Monobutyl (n-butyl) itaconate: 900 g;
Dioxane: 3000 g.

The flask was heated to and kept at a temperature of 100° C. while nitrogen gas was introduced therein.

After 6 g of azobisisobutylonitrile were added to the reaction solution, the resultant mixture was stirred. Within about 1 hour, the internal temperature of the flask reached 103° C. Stirring was further continued. When the viscosity of the solution reached 2,000±100 c.p.s. (at 25° C.), 4000 g of methanol was added to the reaction solution, and then the reaction solution was poured in a large quantity of water to prepare a white copolymer (Copolymer 2). The viscosity of a 20% by weight solution of Copolymer 2 in 2-methoxyethanol was measured to be 120 c.p.s. (25° C.) using a Brookfield rotational viscosimeter.

(2) Adjustment and use of image-forming element

A photosensitive solution of the composition below was coated with a whirler on a polyester film on which aluminum was deposited to a thickness of 1,000 Å. The coated layer was dried at 70° C. for 30 minutes to form a photosensitive layer.
Copolymer 2: 4 g;
Pentaerythritol triacrylate: 4 g;
Benzophenone: 0.3 g;
4,4'-tetraethyldiaminobenzophenone: 0.1 g;
Phenothiazine: 0.02 g;
n-Phenylglycine: 0.1 g;
2-Methoxyethanol: 100 g.
The photosensitive layer had a thickness of 0.7 μm.

After coating an aqueous solution (10% by weight) of a polyvinyl alcohol of low polymerization degree on the photosensitive layer, the coated layer was dried to have a thickness of 1 μm, thereby completing an image-forming element.

After attaching a negative original on the element by vacuum suction, the element was irradiated with light from an ultra high-pressure mercury lamp (1 m distance) of 2 KW for 3 minutes. The element was then immersed in a developing solution of the composition below at 30° C. for 30 seconds.
Sodium hydroxide: 3 g;
Sodium iodate: 10 g;
Trisodium phosphate: 5 g;
Water: 1 l.

The optical image obtained had an optical density of 30 or more and a resolution of 100 lines/mm or more.

In order to reduce the size of dots of a desired portion of the image, the image was brought into contact with a reducing solution of the composition below. The dot area percent of 50% could be reduced to a range of about 10 to 15%. Pinholes did not form in the half tone dots. The swelling and blistering of the resist image was not caused after all the preparatory steps.
Phosphoric acid: 75 ml;
Sodium chloride: 5 g;
Bismuth oxide: 1.5 g;
Water: 25 ml.

EXAMPLE 3

Copolymers 1 to 6 of the compositions shown in Table 1 below were prepared under the same polymerization conditions as those in Example 1. Photosensitive layers were formed under the same conditions as those in Example 2 and the resultant photosensitive layers were exposed. After development and etching, the results as shown below were obtained.

TABLE 1

| | Copolymer | 1 | 2 | 3 | 4** | 5** | 6** |
|---|---|---|---|---|---|---|---|
| Monomer for copolymer (mol %) | Vinyl toluene | 50 | 50 | 50 | | | |
| | Styrene | | | | 50 | | |
| | Maleic anhydride* | 50 | | | 50 | | |
| | Itaconic anhydride* | | | 25 | | | |
| | Monobutyl maleic acid | | | 25 | | | |
| | Monobutyl itaconic acid | | 50 | | | | |
| | Methyl methacrylate | | | | | | 85 |
| | Benzyl methacrylate | | | | | 73 | |
| | Methacrylic acid | | | | | 27 | 15 |
| Viscosity (c.p.s.) at 25° C. of 20 wt. % solution in 2-methoxyethanol | | 150 | 120 | 200 | 200 | 200 | 200 |

TABLE 1-continued

| | | | | | | |
|---|---|---|---|---|---|---|
| Blistering of photosensitive layer after development | None | None | None | Present | None | Present |
| Condition of image film after reducing | Good | Good | Good | — | Orange peel | — |
| Evaluation | Good | Good | Good | Poor | Fair | Poor |

*Mono-butylated after polymerizing by n-butyl alcohol using p-toluene sulfonic acid as a catalyst.
**Copolymers shown to allow comparison with those of Nos. 1, 2 and 3.

EXAMPLE 4

Copolymer 3 was obtained by copolymerization of a three-component system (vinyl toluene, itaconic acid anhydride, and maleic acid monobutyl) and butyl esterification by the same method as that in Example 1.

A photosensitive layer of the composition below was coated on the copolymer with a wire bar and dried to form a photosensitive layer of 0.7 μm dry thickness.
Copolymer 3: 4 g;
Pentaerythritol triacrylate: 4 g;
Benzyldimethylketal: 0.4 g;
p-methoxyphenol: 0.01 g;
Mercaptobenzoxazol: 0.1 g;
"Oil Pink OP" (Orient Kagaku Kogyo): 0.02 g;
Ethylene dichloride: 5 ml;
Ethyl acetate: 5 ml;
2-Methoxyethanol: 5 ml;
Water: 5 ml.

While the photosensitive layer was still wet, an aqueous resin solution of the composition below was coated with a wire bar to a thickness of 1 μm.
Partially saponified polyvinyl alcohol of 500 polymerization degree: 5 g;
Polyvinylpyrrolidone: 5 g;
Benzophenone-o-carboxylic acid: 0.2 g;
p-Nitrophenol: 0.01 g;
Water: 50 ml.

After the coated film was dried with heated air at 120° C. for 3 minutes, it was exposed with light from a light source similar to that used in Example 1. The element was then subjected to similar treatments as in Example 1 to provide a good image.

EXAMPLE 5

A flask similar to that used in Example 1 was charged with a mixture of the composition below. The flask was heated to and kept at a temperature of 90° C. in a warm water bath, while nitrogen gas was introduced therein.
Vinyl toluene: 590 g;
Maleic anhydride: 294 g;
Itacoic anhydride: 112 g;
2-methoxyethanol: 1992 g.

After adding 6 g of azobis-iso-butylonitrile to the reaction solution, the resultant solution was stirred. Then, the temperature of the reaction solution reached the boiling point of 2-methoxyethanol. When the viscosity of the reaction solution reached 2,000±100 c.p.s. (at 25° C.), 1 g of p-methoxyphenol and 1 g of p-toluenesulfonic acid were added to the reaction solution and the resultant solution was stirred. The reaction solution was diluted to a concentration of 20% by weight with 2-methoxymethanol to provide a copolymer having a viscosity of 200 c.p.s. (at 25° C.).

An image-forming element was prepared by the similar procedures as those in Example 1. After development, the swelling and blistering of the resist image of was not caused.

EXAMPLE 6

An image-forming element was prepared and developed by the same procedures as those in Example 2 except that a triacrylate of a propylene oxide (4 mol) addition product of pentaerythritol was used in place of pentaerythritol triacrylate. The swelling and blistering of the resist was not caused.

EXAMPLE 7

The same tests as in Example 1 were performed by varying the composition of the photosensitive layer. The obtained results are shown in Table 2 below.

TABLE 2

| | | 1 | 2 | 3 | 4 | 5 | 6 | 7 | 8 | 9 | 10 | 4 | 11 | 12 |
|---|---|---|---|---|---|---|---|---|---|---|---|---|---|---|
| Composition (wt %) | Pentaerythritol triacrylate | 80 | 70 | 65 | 40 | 35 | 10 | 5 | 49.9 | 49.75 | 47.5 | 40 | 35 | 30 |
| | Benzophenone/4,4'-tetraethyldiaminobenzophenone = 3 parts/1 part | 10 | 10 | 5 | 20 | 10 | 30 | 25 | 0.2 | 0.5 | 5 | 20 | 30 | 40 |
| | Copolymer 2 | 10 | 20 | 30 | 40 | 55 | 60 | 70 | 49.9 | 49.75 | 47.5 | 40 | 35 | 30 |
| Photopolymerizing step No. measured by Kodak's Step Tablet No. 3 | | 1 | 2 | 5 | 9 | 6 | 2 | — | — | 1 | 5 | 9 | 10 | 11 |
| Surface thickness of photosensitive layer | | Present | Slight | None | None | None | None | None | None | None | None | None | None | None |
| Shape of half tone dots | | | Good | Good | Good | Good | Good | — | — | Good | Good | Good | Good | |
| Others | | Film separation | | | | | | Image not formed | Image not formed | | | | | weak photosensi- |

TABLE 2-continued

| | 1 | 2 | 3 | 4 | 5 | 6 | 7 | 8 | 9 | 10 | 4 | 11 | 12 |
|---|---|---|---|---|---|---|---|---|---|---|---|---|---|
| | oc-curred | | | | | | | | | | | | tive layer with rough surface |
| Evaluation | x | | | | | | x | x | | | | | x | x: Poor
○: Good
⊙: Excellent

As may be seen from Table 2, the photosensitive layers of the compositions which did not fall within the scope of the present invention were inferior to those of the present invention.

What we claim is:

1. An image-forming element which comprises a transparent base film, an aluminum film deposited on the base film, and a photosensitive layer formed on the aluminum film and which can be developed with an alkali aqueous solution developer, characterized in that the photosensitive layer comprises (a) 20 to 60% by weight of a copolymer of a vinyl toluene and a monoester of an unsaturated dibasic acid, (b) 10 to 70% by weight of an addition-polymerizable, ethylenically unsaturated monomer which is an acrylate or a methacrylate of a fatty polyhydroxy alcohol having at least two terminal ethylene groups and at least one hydroxyl groups, and (c) 0.5 to 30% by weight of a photopolymerization initiator.

2. An image-forming element according to claim 1, wherein the copolymer is contained in an amount of 30 to 55% by weight, the ethylenically unsaturated monomer is contained in an amount of 35 to 65% by weight, and the photopolymerization initiator is contained in an amount of 5 to 20% by weight.

3. An image-forming element according to claim 1, wherein a protective layer is formed on a surface of the photosensitive layer.

4. An image-forming element according to claim 3, wherein the protective layer comprises one of a cover sheet and an aqueous resin layer.

5. An image-forming element according to claim 4, wherein the cover sheet consists of one of a polyester, polyamide, polypropylene and polyester.

6. An image-forming element according to claim 4, wherein the aqueous resin film consists of one of a polyvinyl alcohol, polyacrylamide and a polyvinyl pyrrolidone.

7. An image-forming element according to claim 1, wherein the photosensitive layer further consists of at least one member selected from the group consisting of a dye, a pigment, a heat polymerization inhibitor, and a chain transfer agent.

8. An image-forming element according to claim 1, wherein the unsaturated dibasic acid is at least one member selected from the group consisting of maleic acid, fumaric acid, and itaconic acid.

9. An image-forming element according to claim 1, wherein the monoester is a member selected from the group consisting of monoalkyl esters having a carbon number of 1 to 10, and esters of a monoalkyl ether having a carbon number of 1 to 10 of one of ethylene glycol and propylene glycol.

10. An image-forming element according to claim 1, wherein the monoester of the unsaturated dibasic acid is a member selected from the group consisting of monobutyl maleate and monobutyl itaconate.

11. An image-forming element according to claim 1, wherein the copolymer consists of 40 to 60 mol% of the vinyl toluene and 40 to 60 mol% of the unsaturated dibasic acid monoester.

12. An image-forming element according to claim 1, wherein the copolymer has an acid value of 50 to 300.

13. An image-forming element according to claim 1, wherein the copolymer has a molecular weight of 1,000 to 1,000,000.

14. An image-forming element according to claim 1, wherein the ethylenically unsaturated monomer is one of an acrylate and a methacrylate of a member selected from the group consisting of trimethylol propane, pentaerythritol, dipentaerythritol and an ethylene or propylene oxide addition product thereof.

15. An image-forming element according to claim 14, wherein the ethylenically unsaturated monomer is pentaerythritol triacrylate.

16. An image-forming element according to claim 1, wherein the base film has a thickness of 50 to 150 $\mu$m, the aluminum layer has a thickness of 500 to 2,000 Å, and the photosensitive layer has a thickness of 0.2 to 20 $\mu$m.

* * * * *